United States Patent [19]

Chen

[11] Patent Number: 4,592,481
[45] Date of Patent: Jun. 3, 1986

[54] RESILIENT STOPPER FOR INTEGRATED CIRCUIT MAGAZINE

[75] Inventor: Charles C. Chen, Houston, Tex.

[73] Assignee: Thomson Components - Mostek Corporation, Carrollton, Tex.

[21] Appl. No.: 768,595

[22] Filed: Aug. 23, 1985

[51] Int. Cl.[4] .............................................. B65D 39/00
[52] U.S. Cl. .......................... 220/307; 220/DIG. 19; 206/328; 206/334
[58] Field of Search ...................... 220/307, DIG. 19; 206/328, 334, 329

[56] References Cited

U.S. PATENT DOCUMENTS 4,487,315 12/1984 Azuma .............................. 206/334
4,515,269 5/1985 Hashimoto .......................... 206/334

*Primary Examiner*—George T. Hall

[57] ABSTRACT

A resilient stopper (40) for retaining IC's (12) in magazine (10) having a rectangular section (16) of height (h) and width (w) is disclosed. The stopper has a tubular body portion (42) of thickness (t), inner diameter (d) and width substantially (w); and a tab (50) within the stopper of thickness (b) and length (L) extending inwardly from a trailing edge area (46) of the body portion (42); wherein $2t+b>h$ to effect a positive interference fit of the stopper within the magazine.

2 Claims, 10 Drawing Figures

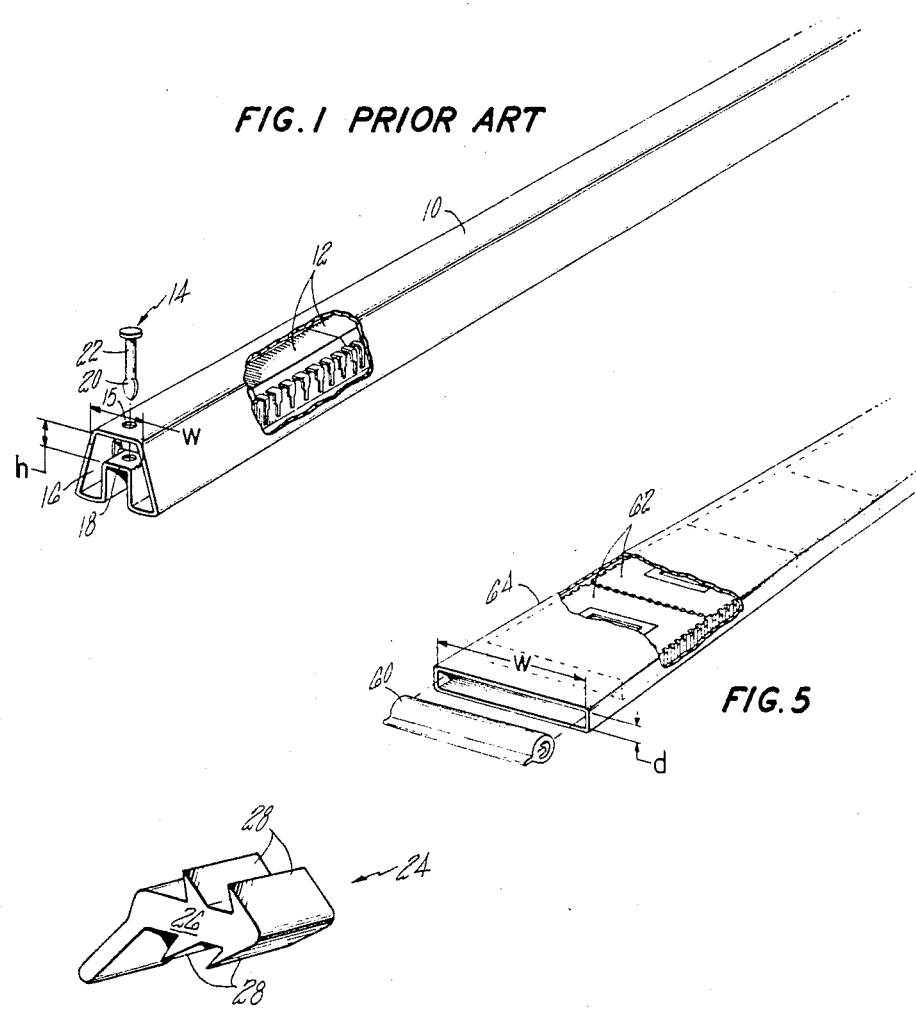
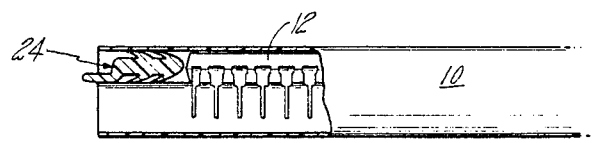

RESILIENT STOPPER FOR INTEGRATED CIRCUIT MAGAZINE

TECHNICAL FIELD OF THE INVENTION

The invention relates to packaging a plurality of integrated circuits, such as dual in-line, leadless chip carrier, and pin grid array packages, in elongated carrier tubes (magazines) for storage and supplying automated insertion machinery.

BRIEF DESCRIPTION OF THE DRAWINGS

FIG. 1 is a perspective, partial cutaway view of an IC magazine 10 of the prior art.

FIGS. 2A and 2B are, respectively, a perspective view of a resilient stopper 24 of the prior art, and a side cross-sectional view of the stopper 24 inserted in a magazine 10. The magazine 10 is shown in longitudinal cross section and the IC 12 is shown in full.

FIG. 5 is a perspective, partial cutaway view of the stopper 60 of this invention for use with a leadless chip carrier 62 and associated magazine 64.

BACKGROUND OF THE INVENTION

Figure 3A:
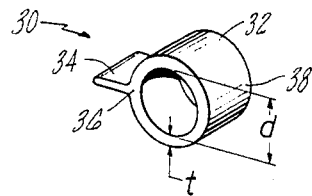
FIGS. 3A, 3B, and 3C are, respectively, a perspective view of a resilient stopper 30 of the prior art, a side view of the stopper 30 immediately prior to insertion in a magazine 10, and a side cross-sectional view of the stopper 30 fully inserted into the magazine 10. The magazine 10 is shown in longitudinal cross section and the IC 12 is shown in full.

Dual in-line packaged integrated circuits are typically stacked end-to-end in an elongated plastic carrier, or magazine. The magazine has an internal end cross section corresponding to the end profile of the IC. In other words, the end cross section of the magazine has a substantially rectangular portion corresponding to the body of the IC and extension portions corresponding to the leads of the IC. The rectangular portion has an internal height h and an internal width w.

In order to prevent longitudinal jostling of the IC's in the magazine, it is known to provide a variety of end stoppers. One type of end stopper is a rigid plastic nail inserted transversely through each end of the magazine. As shown in FIG. 1, a magazine 10 containing a plurality of end-to-end stacked IC's 12 has a nail 14 inserted through a hole 15 in the rectangular portion 16 of a representative end 18. It is evident that prepunched holes make for imprecise restraint of the IC's within the magazine. Furthermore, the tip 20 of the nail is larger than its shank 22, so there will always be a space between the shank of the nail and the endmost IC. Also, as IC packages become larger (increased width w), due to increased pin count, the impact of the nail due to IC movement on the edge of the IC package becomes significant and could cause chipping or cracking of the package. Thus, it is known to provide a resilient stopper in the end of the magazine to restrain the IC's therein.

In FIG. 2A is shown a resilient "fishbone" stopper 24 before insertion in the end of a magazine. The stopper 24 has a body portion 26 and fins 28. FIG. 2B shows a longitudinal (side) cross section of a magazine such as the magazine 10 of FIG. 1 (except for the hole 15). The stopper 24 is inserted longitudinally into the rectangular portion 16 of the magazine 10 against an IC 12, but is slightly greater in height than h so that a resilient interference fit is created thereby. The width of the stopper 24 is approximately w.

A disadvantage of the fishbone stopper 24 is that the contact area between the fins 28 and the inside dimension of the magazine is small, thereby providing limited restraining force against the IC's. It has even been noticed that the fins will tend to roll, or curl, when the stopper 24 is retracted, which negates the effect of static friction.

Figure 3B:
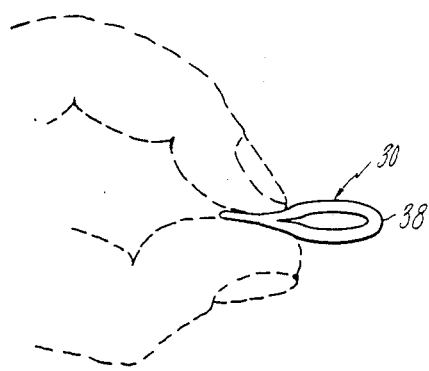
Figure 3C:
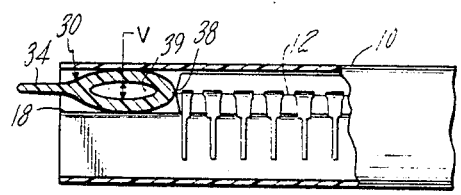

A better resilient stopper 30 is shown in FIG. 3A in its relaxed state, in FIG. 3B in its compressed state for insertion into a magazine 10, and in FIG. 3C inserted within the magazine 10. The stopper 30 comprises a tubular body portion 32 having an axial dimension of approximately w, an inside diameter d, an outside diameter greater than h, a wall thickness t and a radial tab 34 extending from a trailing edge area 36 of the outside diameter of the body portion 32. A leading edge area 38 is diametrically opposed to the trailing edge area 36 and is the portion of the stopper 30 that is first inserted into the magazine. As shown in FIGS. 3B and 3C, insertion of the stopper 30 into the magazine requires collapsing the stopper, inserting the leading edge area 38 longitudinally into the magazine 10, and continuing to insert the stopper fully into the magazine until it is in contact with the IC 12. With proper planning, the trailing tab 34 will extend slightly out of the end 18 of the magazine so that subsequent removal of the stopper is facilitated thereby.

Upon close inspection of FIG. 3C it will be seen that the stopper in its collapsed, magazine-inserted state is not quite fully collapsed. In other words $2t < h$. Rather a void 39 of height v extends its inner dimension. Thus, the leading edge area 38 of the stopper acts as an excellent cushion against the IC. However, the void 39 compromises the effect of the interference fit.

An advantage of the tubular stopper as shown in FIG. 3 is that in order for an IC to force the stopper out, if it hits either high or low on the leading edge area of the stopper, the stopper is required to roll as it is displaced. The dynamic friction associated with rolling is greater than the static friction associated with sliding.

The stopper 30 is made in an extrusion process and chopped up into segments of width substantially w.

The above-described stoppers 24 and 30 are made from a resilient material, such as KRATON, and are available from Meritex Plastics in Arlington, Tex.

DISCLOSURE OF THE INVENTION

It is an object of this invention to provide an improved resilient stopper for insertion into an IC magazine.

According to the invention a resilient stopper (40) for retaining IC's (12) in magazine (10) having a rectangular section (16) of height (h) and width (w) has a tubular body portion (42) of thickness (t), inner diameter (d) and width substantially (w); and a tab (50) within the stopper of thickness (b) and length (c) extending inwardly from a trailing edge area (46) of the body portion (42); wherein $2t + b > h$ to effect a positive interference fit of the stopper within the magazine.

A void (52) remains within the stopper when it is inserted and functions as a "bumper".

DETAILED DESCRIPTION OF THE INVENTION

Figure 4A:
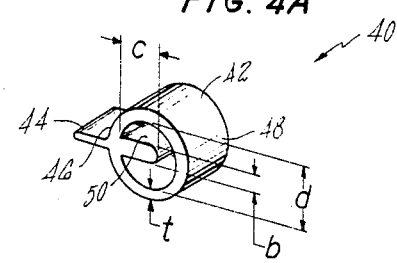
FIGS. 4A, 4B, and 4C are, respectively, a perspective view of the resilient stopper 40 of this invention, a side view of the stopper 40 immediately prior to insertion in a magazine 10, and a side cross-sectional view of the stopper 40 fully inserted into the magazine 10. The magazine 10 is shown in longitudinal cross section and the IC 12 is shown in full.
Figure 4B:
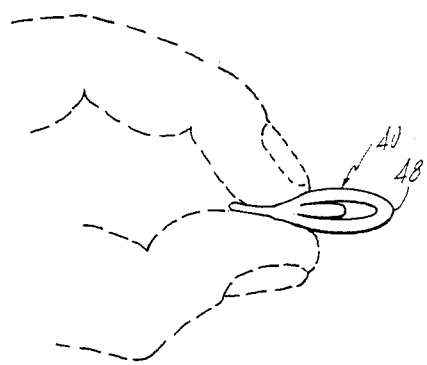
Figure 4C:
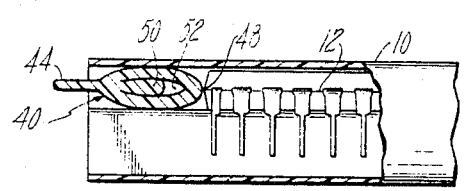

FIG. 4A shows the stopper 40 of this invention in its relaxed pre-insertion state, FIG. 4B shows the stopper 40 collapsed for insertion into a magazine 10, and FIG. 4C shows the stopper 40 fully inserted into the magazine. The stopper 40 has a tubular body portion 42, a radial tab 44 extending outwardly from a trailing edge area 46, and a leading edge area 48 diametrically opposed to the trailing edge area 46; all essentially similar to the counterpart elements 32,34,36,38 of the stopper 30 of FIG. 3.

The notable difference between the stopper 40 of this invention and the stopper 30 of the prior art is the addition of an internal tab 50 inside the body portion 42 at the trailing edge area 46. The tab may extend nearly the inside diameter d of the relaxed stopper; i.e., nearly to the inside of the leading edge area 48. Of course, the die required for the extrusion process limits the length of the internal tab 50.

By simple arithmetic it is evident that an internal tab having a length (c) equal to d will extend only two thirds (2/pi) of the way from the trailing edge to the inner edge area when the stopper is collapsed. (The distance between the insides of the leading and trailing edge areas when the stopper is collapsed is roughly one half the inner circumference of the relaxed stopper, (pi/2)d.

As in the case of the stopper 30 of the prior art, the axial dimension of the stopper 40 is approximately (preferably slightly less than) the width w of the rectangular portion 16 of the magazine 10.

FIG. 4C shows the stopper 40 inserted into the magazine 10. Whereas the stopper 30 of the prior art had a void 39 extending the entire distance between the leading and trailing edge areas 36 and 38, the inserted stopper 40 of this invention has a void 52 extending only from the leading edge area 48 to the internal tab 50; in other words, only half (using (pi/4)d as the internal tab length) the length of the void 39 of the prior art. The void 52 extending from the leading edge area forms a bumper, as in the prior art.

The purposes and advantages of the internal tab 50 are multifold.

Consider an internal tab of thickness b, a stopper wall thickness of t, and a magazine rectangular portion height of h. Generally, b>t and 2t+b will be slightly greater than h to effect a positive interference fit of the stopper 40 within the magazine 10. The positive interference fit of the stopper 40 of this invention will be superior to the resilient fit of the stopper 30 of the prior art, all other factors being equal, thus better retaining the IC's 12.

It has also been found that stopper insertion is easier with the stopper 40 of this invention than with the stopper 30 of the prior art. Again, all other factors being equal, the internal tab makes for a more rigid gripping area (See FIG. 4B) and a stiffer stopper as far as insertion is concerned, without compromising the bumper effect, which will be concentrated at the leading edge area.

FIG. 5 shows the stopper 60 of this invention for association with leadless chip carriers 62 inserted in an essentially rectangular magazine 64 of internal width (w) and height (h). The stopper 60 is essentially an elongated version of the stopper 40 of this invention. Other applications, such as for pin grid array packages, are readily conceivable.

It should be understood that the use of a nail at one end of the magazine and a resilient stopper at the other end, provides convenient end-identification for loading the magazine into an automatic IC insertion machine.

I claim:

1. A resilient stopper (40) for retaining IC's (12) in magazine (10) having a rectangular section (16) of height (h) and width (w) comprising:
    a tubular body portion (42) of thickness (t), inner diameter (d) and width substantially (w); and
    a tab (50) within the stopper of thickness (b) and length (c) extending inwardly from a trailing edge area (46) of the body portion (42);
    wherein 2t+b>h to effect a positive interference fit of the stopper within the magazine.

2. A resilient stopper according to claim 1 wherein c<(pi/2)d so that there is a void (52) in a leading edge area (48) of the stopper.

* * * * *